(12) United States Patent
Lee et al.

(10) Patent No.: US 11,127,796 B2
(45) Date of Patent: Sep. 21, 2021

(54) DISPLAY PANEL WITH INTEGRATED PRESSURE SENSOR AND PRINTED CIRCUIT BOARD

(71) Applicant: Samsung Display Co., Ltd., Yongin-si (KR)

(72) Inventors: Kang Won Lee, Seoul (KR); Choon Hyop Lee, Anyang-si (KR); Seung Hwan Chung, Seongnam-si (KR); Sang Chui Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/827,559

(22) Filed: Mar. 23, 2020

(65) Prior Publication Data

US 2020/0312918 A1    Oct. 1, 2020

(30) Foreign Application Priority Data

Mar. 26, 2019  (KR) .................. 10-2019-0034458

(51) Int. Cl.
*G06F 3/041* (2006.01)
*H01L 27/32* (2006.01)

(52) U.S. Cl.
CPC .......... *H01L 27/323* (2013.01); *G06F 3/0412* (2013.01); *G06F 2203/04103* (2013.01); *G06F 2203/04105* (2013.01)

(58) Field of Classification Search
CPC ............................ G06F 3/0414–04146; G06F 2203/04105–04106
See application file for complete search history.

(56) References Cited

U.S. PATENT DOCUMENTS

| 2012/0293450 | A1* | 11/2012 | Dietz | G06F 3/04144 |
| | | | | 345/174 |
| 2013/0265256 | A1* | 10/2013 | Nathan | G06F 3/04144 |
| | | | | 345/173 |
| 2015/0091858 | A1* | 4/2015 | Rosenberg | G06F 3/045 |
| | | | | 345/174 |
| 2018/0284935 | A1* | 10/2018 | Lee | G06F 1/1652 |
| 2018/0293420 | A1* | 10/2018 | Kim | G06K 9/0002 |
| 2018/0299997 | A1* | 10/2018 | Isaacson | G06F 3/04144 |
| 2019/0114004 | A1* | 4/2019 | Lee | G06F 3/0418 |
| 2020/0201465 | A1 | 6/2020 | Lee et al. | |
| 2021/0026484 | A1* | 1/2021 | Kim | G06F 3/044 |

FOREIGN PATENT DOCUMENTS

| KR | 10-1301277 | 8/2013 |
| KR | 10-1360116 | 2/2014 |
| KR | 10-2018-0129370 | 12/2018 |
| KR | 10-2020-0013203 | 2/2020 |
| KR | 10-2020-0077643 | 7/2020 |

* cited by examiner

*Primary Examiner* — Sanjiv D. Patel
(74) *Attorney, Agent, or Firm* — H.C. Park & Associates, PLC

(57) ABSTRACT

A display panel includes: a printed circuit board disposed at one side of the display panel, the printed circuit board, having: a pattern portion including a surface, a first driving electrode and a first sensing electrode disposed on the first surface; and a cover portion facing the surface of the pattern portion and including a first pressure sensing layer overlapping the first driving electrode and the first sensing electrode.

17 Claims, 16 Drawing Sheets

DISPLAY PANEL WITH INTEGRATED PRESSURE SENSOR AND PRINTED CIRCUIT BOARD

CROSS REFERENCE TO RELATED APPLICATION

This application claims priority from and the benefit of Korean Patent Application No. 10-2019-0034458, filed on Mar. 26, 2019, which is hereby incorporated by reference for all purposes as if fully set forth herein.

BACKGROUND

Field

The exemplary implementations of the invention generally relate to a display panel and, more particularly, to display panel having an integrated pressure sensor and printed circuit board.

Discussion of the Background

The importance of display devices has increased with the development of multimedia.

Accordingly, various types of display devices such as a liquid crystal display (LCD) and an organic light emitting display (OLED) have been used. Among them, the organic light emitting display (OLED) has attracted considerable intention as a next-generation display device because it is a self-luminous display device and has an excellent viewing angle.

Recently, in the fields of smart phones and tablet PCs, a touch panel recognizing a touch input has been widely applied to a display device. The trend in touch panels is to replace the existing physical input device(s) such as a keypad because of the convenience of touching. Research has been conducted to implement various inputs by mounting a pressure sensor in addition to the touch panel on a display device.

The pressure sensor has a structure in which a substrate including a driving electrode, a sensing electrode and the like is spaced apart from another substrate including a pressure sensing layer, and may be driven by electrical connection with a control circuit board. Therefore, the control circuit board may include a connector terminal connected to the connection portion of the pressure sensor.

The above information disclosed in this Background section is only for understanding of the background of the inventive concepts, and, therefore, it may contain information that does not constitute prior art.

SUMMARY

Applicant realized that there may be difficulty in providing space for mounting the connector terminal to the control circuit board due to the slimness of the display device.

Display devices constructed according to the principles and exemplary implementations of the invention integrate an activation region, which may include a pressure sensor, and a control circuit board to reduce the space required to accommodate same in a display panel. Accordingly, in some exemplary implementations of the invention, a pressure sensor may be integrated with the display circuit board by forming the lower surface of the pressure sensor as the same layer as an upper surface of the display circuit board.

Additional features of the inventive concepts will be set forth in the description which follows, and in part will be apparent from the description, or may be learned by practice of the inventive concepts.

According to an aspect of the invention, a display panel includes: a printed circuit board disposed at one side of the display panel, the printed circuit board having: a pattern portion including a surface, a first driving electrode and a first sensing electrode disposed on the first surface; and a cover portion facing the surface of the pattern portion and including a first pressure sensing layer overlapping the first driving electrode and the first sensing electrode.

An insulating layer may be disposed on the surface of the pattern portion, the insulating layer exposing the first driving electrode and the first sensing electrode.

The pattern portion may further include a second driving electrode and a second sensing electrode disposed on the surface of the pattern portion.

The pattern portion may further include a second pressure sensing layer contacting the second driving electrode and the second sensing electrode.

The second pressure sensing layer may be disposed on at least one side surface of the second driving electrode and at least one side surface of the second sensing electrode.

A gap may be provided between the first pressure sensing layer and the first driving electrode and between the first pressure sensing layer and the first sensing electrode.

The cover may further include a spacer to maintain the gap.

The cover may further include an adhesive member on one surface.

The printed circuit board may be bent and be attached to one surface of the display panel by the adhesive member.

A panel lower member may be disposed between one surface of the display panel and the printed circuit board.

The first driving electrode may include a plurality of first driving electrodes and the first sensing electrode may include a plurality of first sensing electrodes spaced apart from each other, the first driving electrodes and the first sensing electrodes may be elongated in a first direction, and the first driving electrodes and the first sensing electrodes may be alternately spaced apart in a second direction intersecting the first direction.

A driving connection electrode may be coupled to the first driving electrodes and the second driving electrodes; and a sensing connection electrode may be coupled to the first sensing electrodes and the second sensing electrodes.

A driving line may be coupled to the driving connection electrode to apply a driving voltage; and a sensing line may be coupled to the sensing connection electrode.

The printed circuit board may include a pressure sensing driver on a second surface opposite to the first surface, and the pressure sensing driver may be electrically coupled to the driving line and the sensing line through a contact hole.

According to another aspect of the invention, a display panel includes a printed circuit board disposed at one side of the display panel, the printed circuit board has: a pattern portion including a surface, a first driving electrode, a first sensing electrode, a second driving electrode, and a second sensing electrode, which may be disposed on the surface; and a cover portion facing the surface of the pattern portion and including a first pressure sensing layer overlapping the first driving electrode and the first sensing electrode and a second pressure sensing layer overlapping the second driving electrode and the second sensing electrode.

An insulating layer disposed on the surface of the pattern portion, the insulating layer exposing the first driving electrode, the first sensing electrode, the second driving electrode, and the second sensing electrode.

A gap may be provided between the first pressure sensing layer and the first driving electrode and between the first pressure sensing layer and the first sensing electrode.

The cover portion may further include a spacer to maintain the gap.

The second pressure sensing layer may contact the second driving electrode and the second sensing electrode.

An adhesive member may be on one surface of the cover.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
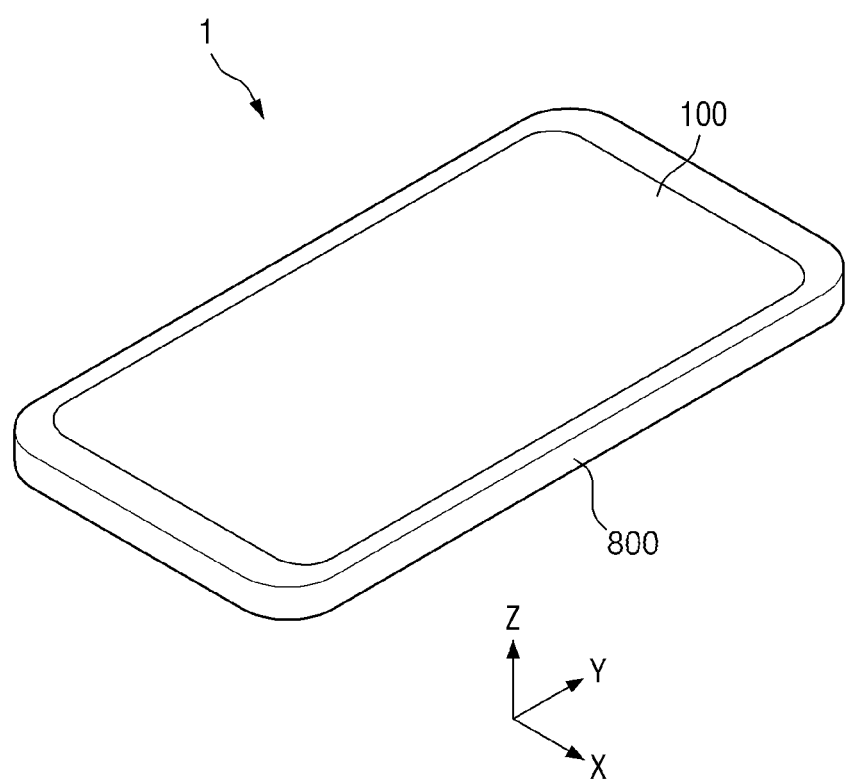
FIG. 1 is a perspective view of an exemplary embodiment of a display device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
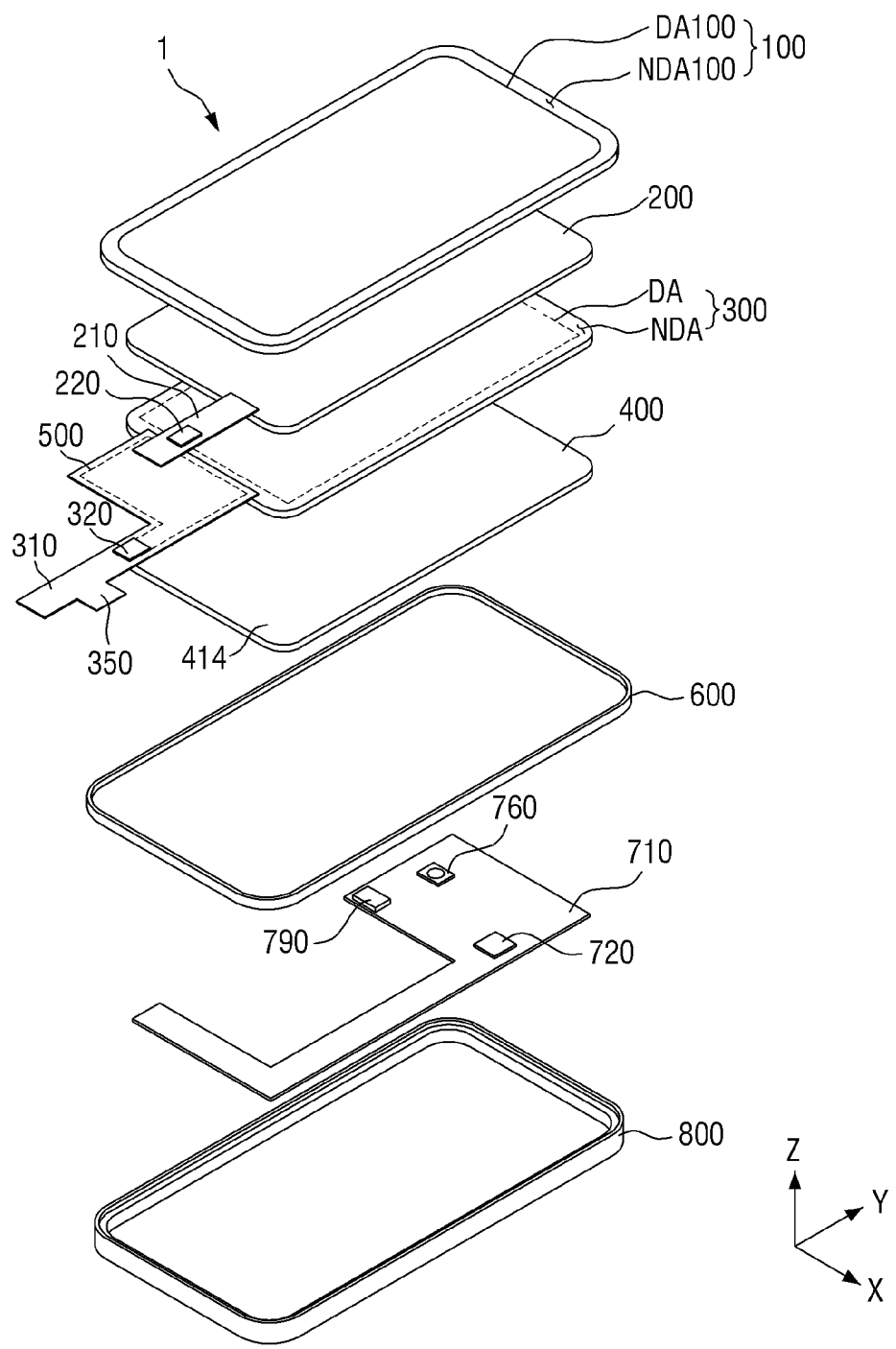
FIG. 2 is an exploded perspective view of the display device of FIG. 1.

FIG. 1 is a perspective view of an exemplary embodiment of a display device constructed according to principles of the invention, and FIG. 2 is an exploded perspective view of the display device of FIG. 1.

Referring to FIGS. 1 and 2, a display device 1 according to an exemplary embodiment includes a cover window 100, a touch sensing unit 200, a touch circuit board 210, a display panel 300, a display circuit board 310, a panel lower member 400, an activation member, such as pressure sensor 500, which produces an electronic signal in response to sensing an external condition such as pressure, a lower bracket 600, a main circuit board 710, and a lower cover 800.

In this specification, the "on", "over", "top", "upper side", or "upper surface" refers to a direction in which the cover window 100 is disposed with respect to the display panel 300, that is, a Z-axis direction, and the "beneath", "under", "bottom", "lower side", or "lower surface" refers to a direction in which the panel lower member 400 is disposed with respect to the display panel 300, that is, a direction opposite to the Z-axis direction.

The display device 1 may have a generally rectangular shape in a plan view. For example, the display device 1 may have a generally rectangular planar shape having short sides in the first direction (X-axis direction) and long sides in the second direction (Y-axis direction). The edge where the short side in the first direction (X-axis direction) meets the long side in the second direction (Y-axis direction) may be formed to have a generally round shape of a predetermined curvature or have a generally right angle shape. The planar shape of the display device 1 is not limited to a generally rectangular shape, and may be formed in another generally polygonal shape, generally circular shape, or generally elliptical shape.

The cover window 100 may be disposed on the display panel 300 so as to cover the upper surface of the display panel 300. Thus, the cover window 100 may function to protect the upper surface of the display panel 300. The cover window 100 may be attached to the touch sensing unit 200 through an adhesive layer. The adhesive layer may be an optically clear adhesive (OCA) or an optically clear resin (OCR).

The cover window 100 may include a light transmitting area DA100 corresponding to a display area DA of the display panel 300 and a light blocking area NDA100 corresponding to a non-display area NDA of the display panel 300. The light blocking area NDA100 of the cover window 100 may be formed to be opaque. Alternatively, the light blocking area NDA100 of the cover window 100 may be formed as a decorative layer having a pattern that can be seen to a user when an image is not displayed. For example, a company logo or various characters may be patterned on the light blocking area NDA100 of the cover window 100.

The cover window 100 may be made of glass, sapphire, and/or plastic. The cover window 100 may be rigid or flexible.

The touch sensing unit 200 including touch sensors for sensing a user's touch may be disposed between the cover window 100 and the display panel 300. The touch sensing unit 200 is a unit for sensing a touch position of a user, and may be implemented in a capacitive manner such as a self-capacitance manner or a mutual capacitance manner, or may be implemented in an infrared manner.

The touch sensing unit 200 may be formed in the shape of a panel or a film. Alternatively, the touch sensing unit 200 may be formed to be integrated with the display panel 300. For example, when the touch sensing unit 200 is formed in the shape of a film, the touch sensing unit 200 may be formed to be integrated with a barrier film for encapsulating the display panel 300.

The touch circuit board 210 may be attached to one side of the touch sensing unit 200. Specifically, the touch circuit board 210 may be attached onto the pads provided on one side of the touch sensing unit 200 using an anisotropic conductive film. Further, the touch circuit board 210 may be provided with a touch connection portion, and the touch connection portion may be connected to a touch connector of the display circuit board 310. The touch circuit board 210 may be a flexible printed circuit board or a chip on film.

The touch driver 220 may apply touch driving signals to the touch sensing unit 200, detect sensing signals from the touch sensing unit 200, and analyze the sensing signals to calculate the touch position of a user. The touch driver 220 may be formed as an integrated circuit and mounted on the touch circuit board 210.

The display panel 300 may include a display area DA and a non-display area NDA. The display area DA may be an area in which an image is displayed, and the non-display area NDA may be an area in which no image is displayed and may be a peripheral area of the display area NDA. The non-display area NDA may be disposed to surround the display area DA as shown in FIG. 2, but the exemplary embodiments are not limited thereto. The display area DA may be disposed to overlap the light transmitting area 100DA of the cover window 100, and the non-display area NDA may be disposed to overlap the light blocking area 100NDA of the cover window 100.

The display panel 300 may be a light emitting display panel including a light emitting element. For example, the display panel 300 may include an organic light emitting display panel using an organic light emitting diode, an ultra-micro light emitting diode display panel using an ultra-micro light emitting diode (LED), or a quantum dot light emitting diode display panel using a quantum dot light emitting diode. Hereinafter, it is assumed that the display panel 300 is an organic light emitting display panel as shown in FIG. 3.

Figure 3:
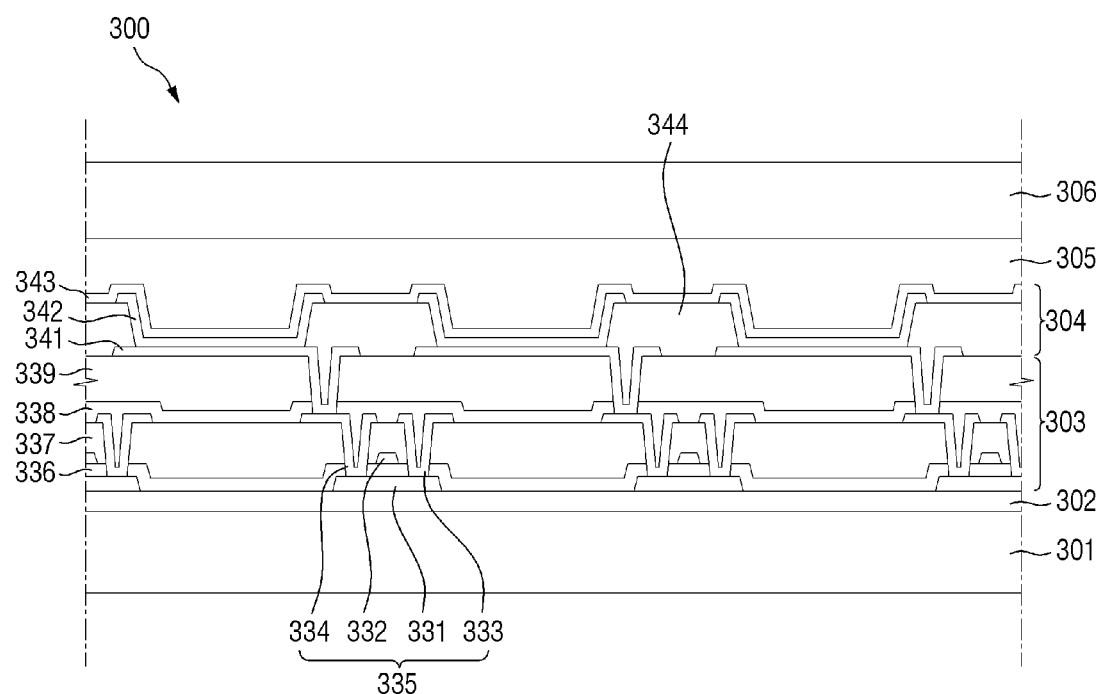
FIG. 3 is a cross-sectional view of an exemplary embodiment of the display area of the display panel of FIG. 2.

FIG. 3 is a cross-sectional view of an exemplary embodiment of the display area of the display panel of FIG. 2.

The display area DA of the display panel 300 refers to an area where a light emitting element layer 304 is formed to display an image, and the non-display area NDA thereof refers to a peripheral area of the display area DA.

Referring to FIG. 3, the display panel 300 may include a support substrate 301, a flexible substrate 302, a thin film transistor layer 303, a light emitting element layer 304, an encapsulation layer 305, and a barrier film 306.

The flexible substrate 302 is disposed on the support substrate 301. Each of the support substrate 301 and the flexible substrate 302 may include a polymer material having flexibility. For example, each of the support substrate 301 and the flexible substrate 302 may include polyethersulphone (PES), polyacrylate (PA), polyarylate (PAR), polyetherimide (PEI), polyethylene naphthalene (PEN), polyethylene terephthalate (PET), polyphenylene sulfide (PPS), polyallylate, polyimide (PI), polycarbonate (PC), cellulose triacetate (CTA), cellulose acetate propionate (CAP), or a combination thereof.

The thin film transistor layer 303 is disposed on the flexible substrate 302. The thin film transistor layer 303 includes thin film transistors 335, a gate insulating layer 336, an interlayer insulating layer 337, a protective layer 338, and a planarization layer 339.

A buffer layer may be formed on the flexible substrate 302. The buffer layer may be formed on the flexible substrate 302 so as to protect thin film transistors 335 and light emitting elements from moisture penetrating through the support substrate 301 and the flexible substrate 302 which are vulnerable to moisture. The buffer layer may be formed of a plurality of alternately laminated inorganic layers. For example, the buffer layer may be formed of a multi-layer structure in which one or more inorganic layers including one or more of a silicon oxide ($SiO_x$), a silicon nitride ($SiN_x$), and SiON are alternately stacked. The buffer layer may be omitted.

Figure 8:
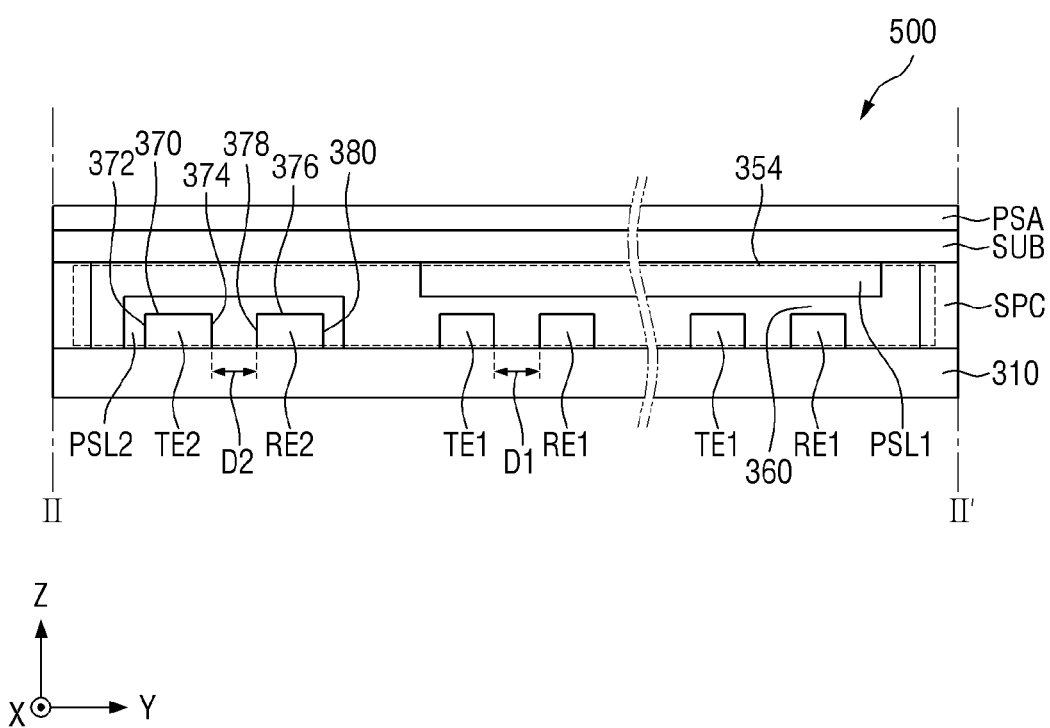
FIG. 8 is a cross-sectional view taken along the line II-II' of FIG. 7.

The thin film transistor 335 is formed on the buffer layer. The thin film transistor 335 includes an active layer 331, a gate electrode 332, a source electrode 333, and a drain electrode 334. Although FIG. 8 shows that the thin film transistor 335 is formed by a top gate type in which the gate electrode 332 is located on the active layer 331, it should be noted that the exemplary embodiments are not limited thereto. That is, the thin film transistor 335 may be formed by a bottom gate type in which the gate electrode 332 is located beneath the active layer 331, or may be formed by a double gate type in which the gate electrode 332 is located both on and beneath the active layer 331.

The active layer 331 is formed on the buffer layer or flexible substrate 302. The active layer 331 may be formed of a silicon-based semiconductor material or an oxide-based semiconductor material. A light blocking layer for blocking external light incident on the active layer 331 may be formed between the buffer film and the active layer 331.

The gate insulating layer 336 may be formed on the active layer 331. The gate insulating layer 336 may be formed as an inorganic layer, for example, a silicon oxide ($SiO_x$) film, a silicon nitride ($SiN_x$) film, or a combination thereof.

The gate electrode 332 and a gate line may be formed on the gate insulating layer 336. The gate electrode 332 and the gate line may be formed of a single layer or a multi-layer including at least one of molybdenum (Mo), aluminum (Al), chromium (Cr), gold (Au), titanium (Ti), nickel (Ni), neodymium (Nd) and copper (Cu), or an alloy thereof.

The interlayer insulating layer 337 may be formed on the gate electrode 332 and the gate line. The interlayer insulating layer 337 may be formed as an inorganic layer, for example, a silicon oxide ($SiO_x$) layer, a silicon nitride ($SiN_x$) layer, or a combination thereof.

The source electrode 333, the drain electrode 334, and a data line may be formed on the interlayer insulating layer 337. Each of the source electrode 333 and the drain electrode 334 may be connected to the active layer 331 through a contact hole penetrating the gate insulating layer 336 and the interlayer insulating layer 337. The source electrode 333, the drain electrode 334, and the data line may be formed of a single layer or a multi-layer including at least one of molybdenum (Mo), aluminum (Al), chromium (Cr), gold (Au), titanium (Ti), nickel (Ni), neodymium (Nd) and copper (Cu), or an alloy thereof.

The protective layer 338 for insulating the thin film transistor 335 may be formed on the source electrode 333, the drain electrode 334, and the data line. The protective layer 338 may be formed as an inorganic layer, for example, a silicon oxide ($SiO_x$) layer, a silicon nitride ($SiN_x$) layer, or a combination thereof.

The planarization layer 339 for flattening a step due to the thin film transistor 335 may be formed on the protective layer 338. The planarization layer 339 may be formed as an organic layer including an acryl resin, an epoxy resin, a phenolic resin, a polyamide resin, or a polyimide resin.

The light emitting element layer 304 is formed on the thin film transistor layer 303. The light emitting element layer 304 includes light emitting elements and a pixel defining layer 344.

The light emitting elements and the pixel defining layer 344 are formed on the planarization layer 339. The light emitting element may be an organic light emitting element. In this case, the light emitting element may include an anode electrode 341, light emitting layers 342, and a cathode electrode 343.

The anode electrode 341 may be formed on the planarization layer 339. The anode electrode 341 may be connected to the source electrode 333 of the thin film transistor 335 through a contact hole penetrating the protective layer 338 and the planarization layer 339.

The pixel defining layer 344 may be formed on the planarization layer 339 to cover the edge of the anode electrode 341 so as to define pixels. That is, the pixel defining layer 344 serves to define pixels. Each of the pixels refers to an area where the anode electrode 341, the light emitting layers 342, and the cathode electrode 343 are sequentially laminated, and holes from the anode electrode 341 and electrons from the cathode electrode 343 are combined with each other in the light emitting layers 342 to emit light.

The light emitting layers 342 are formed on the anode electrode 341 and the pixel defining layer 344. Each of the light emitting layers 342 is an organic light emitting layer. The light emitting layers 342 may emit one of red light, green light, and blue light. The peak wavelength range of red light may be about 620 nm to about 750 nm, and the peak wavelength range of green light may be about 510 nm to about 570 nm. Further, the peak wavelength range of blue light may be about 450 nm to about 495 nm. The light emitting layers 342 may be a white light emitting layer that emits white light. In this case, the light emitting layers 342 may have a laminate structure of a red light emitting layer, a green light emitting layer, and a blue light emitting layer, and may be a common layer formed commonly in the pixels. In this case, the display panel 300 may further include separate color filters for displaying red, green, and blue colors.

The light emitting layers 342 may include a hole transporting layer, a light emitting layer, and an electron transporting layer. Further, the light emitting layers 342 may be formed to have a tandem structure of two stacks or more, and in this case, a charge generating layer may be formed between the stacks.

The cathode electrode 343 is formed on the light emitting layers 342. The cathode electrode 343 may be formed to cover the light emitting layers 342. The cathode electrode 343 may be a common layer formed commonly in the pixels.

When the light emitting element layer 304 is formed by a top emission manner in which light is emitted upward, the anode electrode 341 may be formed of a high-reflectance metal material such as a laminate structure (Ti/Al/Ti) of aluminum and titanium, a laminate structure (ITO/Al/ITO) of aluminum and TIO, an APC alloy, or a laminate structure (ITO/APC/ITO) of an APC alloy and ITO. The APC alloy may be an alloy of silver (Ag), palladium (Pd), and copper alloy (Cu). The cathode electrode 343 may be formed of a transparent conductive material (TCO) such as ITO or IZO, which is light-transmissive, or a semi-transmissive conductive material such as magnesium (Mg), silver (Ag), or an alloy of magnesium (Mg) and silver (Ag). When the cathode electrode 343 is formed of a semi-transmissive conductive material, light emission efficiency may be increased by microcavities.

When the light emitting element layer 304 is formed by a bottom emission manner for the downward emission of light, the anode electrode 341 may be formed of a transparent conductive material (TCO) such as ITO or IZO, or a semi-transmissive conductive material such as magnesium (Mg), silver (Ag), or an alloy of magnesium (Mg) and silver (Ag). The cathode electrode 343 may be formed of a high-reflectance metal material such as a laminate structure (Ti/Al/Ti) of aluminum and titanium, a laminate structure (ITO/Al/ITO) of aluminum and TIO, an APC alloy, or a laminate structure (ITO/APC/ITO) of an APC alloy and ITO. When the anode electrode 341 is formed of a semi-transmissive conductive material, light emission efficiency may be increased by microcavities.

The encapsulation layer 305 is formed on the light emitting element layer 304. The encapsulation layer 305 serves to prevent oxygen or moisture from permeating the light emitting layers 342 and the cathode electrode 343. For this purpose, the encapsulation layer 305 may include at least one inorganic layer. The inorganic layer may be formed of silicon nitride, aluminum nitride, zirconium nitride, titanium nitride, hafnium nitride, tantalum nitride, silicon oxide, aluminum oxide, or titanium oxide. The encapsulation layer 305 may further include at least one organic layer. The organic layer may be formed to have a sufficient thickness to prevent foreign matter (particles) from penetrating the encapsulation layer 305 and entering the light emitting layers 342 and the cathode electrode 343. The organic layer may include any one of epoxy, acrylate, and urethane acrylate.

The barrier film 306 is disposed on the encapsulation layer 305. The barrier film 306 is disposed to cover the encapsulation layer 305 to protect the light emitting element layer 304 from oxygen and moisture. The barrier film 306 may be formed to be integrated with the touch sensing unit 200.

A polarizing layer may be additionally attached onto the upper surface of the display panel 300 to prevent the deterioration of visibility due to external light reflection. In some exemplary embodiments, the polarizing layer may be omitted.

The display circuit board 310 may be attached to one side of the display panel 300. Specifically, the display circuit board 310 may be attached onto the pads provided on one side of the display panel 300 using an anisotropic conductive film.

The touch circuit board 210 and the display circuit board 310 may be bent downward from the upper portion of the display panel 300. The display circuit board 310 may be connected to the touch connection portion of the touch circuit board 210 through a connector. Alternatively, the display circuit board 310 may include pads instead of the connector. In this case, the display circuit board 310 may be connected to the touch circuit board 210 using anisotropic conductive films. The display circuit board 310 may be connected to the main circuit board 710 through a display connection portion 350.

The display driver 320 outputs signals and voltages for driving the display panel 300 through the display circuit board 310. The display driver 320 may be formed as an integrated circuit and mounted on the display circuit board 310, but the exemplary embodiments are not limited thereto. For example, the display driver 320 may be attached to one side of the display panel 300.

The panel lower member 400 may be disposed on the lower surface of the display panel 300. The panel lower member 400 may include at least one of a heat radiation layer for efficiently emitting heat of the display panel 300, an electromagnetic wave blocking layer for blocking electromagnetic waves, a light blocking layer for blocking external light, a light absorbing layer for absorbing external light, and a buffer layer for absorbing an external impact.

Specifically, the panel lower member 400 may include a light absorbing member, a buffer member, and a heat radiation member.

The light absorbing member may be disposed under the display panel 300. The light absorbing member inhibits the transmission of light to prevent components disposed under the light absorbing member, e.g., pressure sensor 500, and the like from being viewed from above the display panel 300. The light absorbing member may include a light absorbing material such as a black pigment or a black dye.

The buffer member may be disposed under the light absorbing member. The buffer member absorbs an external impact to prevent the display panel 300 from being damaged. The buffer member may be composed of a single layer or a plurality of layers. For example, the buffer member may be formed of a polymer resin such as polyurethane, polycarbonate, polypropylene, or polyethylene, or may be formed of an elastic material such as a rubber, a urethane material, or a sponge formed by foaming an acrylic material. The buffer member may be a cushion layer.

The heat radiation member may be disposed under the buffer member. The heat radiation member may include at least one heat radiation layer. For example, the heat radiation member may include a first heat radiation layer including graphite or carbon nanotubes and a second heat radiation layer capable of blocking electromagnetic waves and formed of a metal thin film of copper, nickel, ferrite or silver having excellent thermal conductivity.

The pressure sensor 500 may be disposed on one surface of the display circuit board 310 to form an integrated structure. When the display circuit board 310 is bent, the pressure sensor 500 may be disposed close to one side of the panel lower member 400. The pressure sensor 500 may detect the pressure applied to the NDA100 of the cover window 100. The pressure sensor 500 may be used as an input device that produces an electrical signal to activate one or more components. In some exemplary embodiments, the pressure sensor 500 may be used as a substitute for a physical button of the display device 1.

For example, the pressure sensor 500 disposed close to one side 414 of the panel lower member 400 may be used as a substitute for a home button of the display device 1. For example, when first pressure is detected from the pressure sensor 500 disposed close to one side 414 of the panel lower member 400, a screen of the display device 1 may be turned on.

The lower bracket 600 may be disposed under the panel lower member 400. The lower bracket 600 may include a synthetic resin, a metal, or both a synthetic resin and a metal.

Specifically, the lower bracket 600 may be disposed to surround the cover window 100, the touch sensing unit 200, the display panel 300, the panel lower member 400, the pressure sensor 500, the touch circuit board 210, the display circuit board 310, and the like. According to the embodiment of the display device 1, the side surface of the lower bracket 600 may be exposed to the side surface of the display device 1, or the lower bracket 600 may be omitted and only the lower cover 800 may be provided.

The main circuit board 710 may be disposed under the lower bracket 600. The main circuit board 710 may be connected to the display connection portion 350 of the display circuit board 310 through a cable connected to a main connector 790. Thus, the main circuit board 710 may be electrically connected to the display circuit board 310 and the touch circuit board 210. The main circuit board 710 may be a printed circuit board or a flexible printed circuit board.

The main circuit board 710 may include a main processor 720 and a camera device 760 as shown in FIG. 2. Although FIG. 2 shows that the main processor 720, the camera device 760, and the main connector 790 are mounted on one surface of the main circuit board 710 facing the lower bracket 600, the exemplary embodiments are not limited thereto. That is, the main processor 720, the camera device 760, and the main connector 790 may be mounted on the other surface of the main circuit board 710 facing the lower bracket 600.

The main processor 720 may control all the functions of the display device 1. For example, the main processor 720 may output image data to the display driver 320 of the display circuit board 310 such that the display panel 300 displays an image. Further, the main processor 720 may receive touch data from the touch driver 220, determine the touch position of a user, and then execute an application indicated by an icon displayed at the touch position of the user. Further, the main processor 720 may control the volume of a sound of the display device 1, or may control the display device 1 to implement a haptic. The main processor 720 may be an application processor, a central processing unit, or a system chip, which includes an integrated circuit.

The camera device 760 processes an image frame such as a still image or a moving image obtained by an image sensor in a camera mode, and outputs the processed image frame to the main processor 720.

In addition, the main circuit board 710 may be further provided with a mobile communication module capable of transmitting and receiving a radio signal to/from at least one of a base station, an external terminal, and a server. The radio signal may include various types of data depending on a voice signal, a video call signal, or a text/multimedia message transmission/reception. Further, the main circuit board 710 may further include a sound output device capable of outputting sound, and a vibration device capable of generating vibration for haptic implementation.

The lower cover 800 may be disposed under the lower bracket 600 and the main circuit board 710. The lower cover 800 may form a lower surface appearance of the display device 1. The lower cover 800 may include plastic and/or metal.

Figure 4:
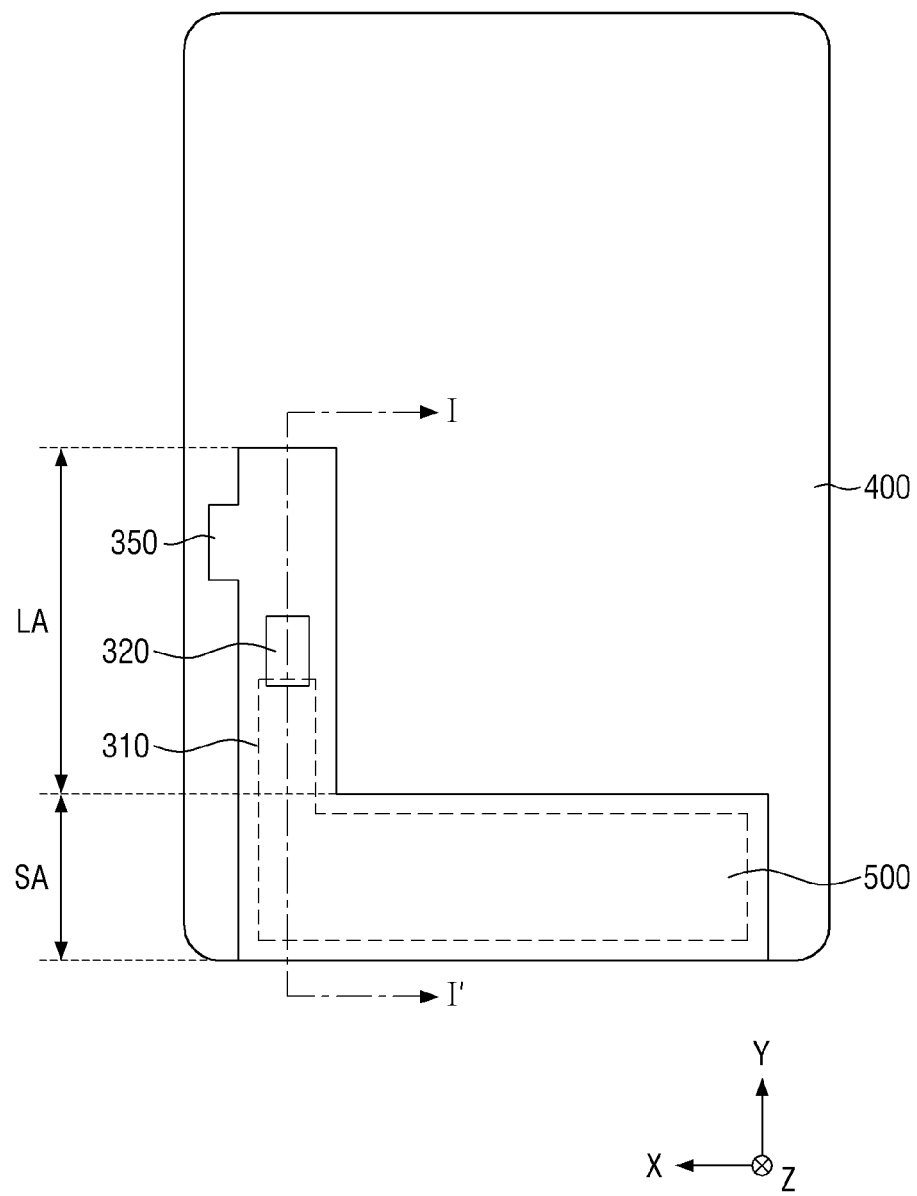
FIG. 4 is a bottom, plan view of an exemplary embodiment of the display circuit board of FIG. 2 that is bent and disposed on a panel lower member.
Figure 5:
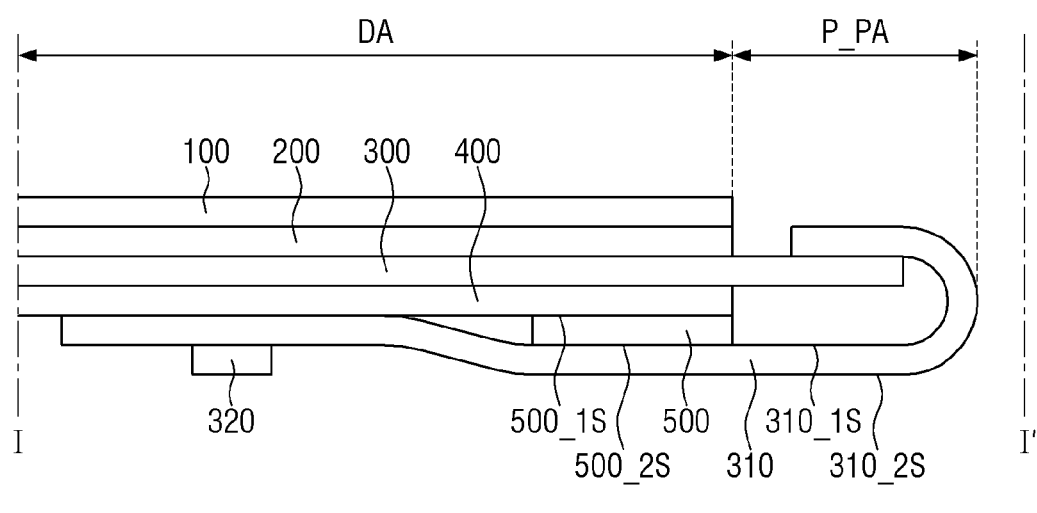
FIG. 5 is a cross-sectional view taken along the line I-I' of FIG. 4.
Figure 5:
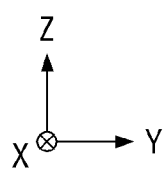

FIG. 4 is a bottom, plan view of an exemplary embodiment of the display circuit board bent of FIG. 2 that is bent and disposed on a panel lower member, and FIG. 5 is a cross-sectional view taken along the line I-I' of FIG. 4. FIGS. 1 and 2 are plan perspective views, whereas FIG. 4 is a bottom view. Therefore, it should be noted that the left and right of the display device 1 of FIGS. 1 and 2 are reversed in FIG. 4.

Referring to FIGS. 2, 4, and 5, the display circuit board 310 disposed on the panel lower member 400 may include a display driver 320, a display connection portion 350, and a pressure sensor 500.

Figure 6:
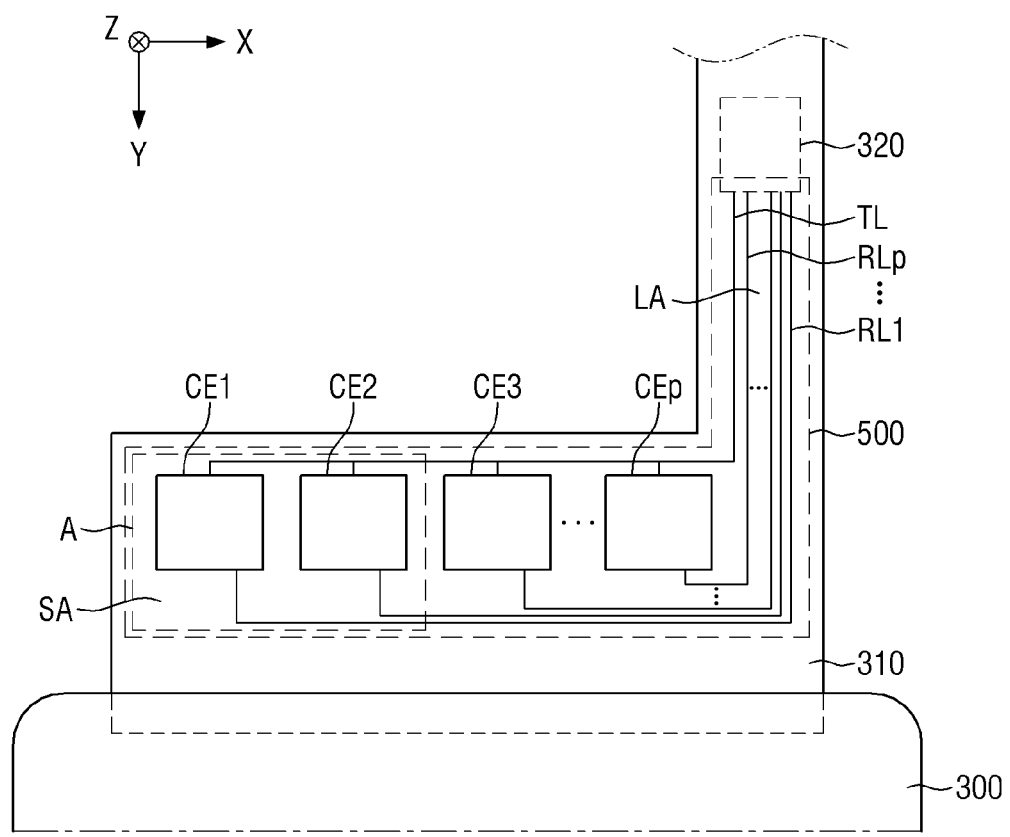
FIG. 6 is a bottom, plan view of an exemplary embodiment of a pressure sensor integrated with display circuit board of FIG. 2.

As shown in FIG. 6, the display circuit board 310 may include a sensing area SA in which pressure sensing cells CE are arranged and a wiring area in which a driving line TL and first to p-th sensing lines are disposed LA. According to an embodiment, the display driver 320 and the display connection portion 350 may be disposed in the wiring area LA, and the pressure sensor 500 may be disposed in the sensing area SA and a portion of the wiring area LA.

The display panel 300 may include a display area DA and a panel pad area P_PA. The touch sensing unit 200 may be disposed on one surface of the display panel 300, and the cover window 100 may be disposed on one surface of the touch sensing unit 200. The display circuit board 310 may be attached to one side of the panel pad area P_PA of the display panel 300 and bent toward the lower surface of the display panel 300. In this case, a portion of the display circuit board 310 may be bent around and overlap the display area DA.

The display circuit board 310 may include a first surface 310_1S facing one surface of the panel lower member 400, and a second surface 310_2S opposite to the first surface 310_1S. According to an embodiment, the pressure sensor 500 may be disposed on the first surface 310_1S, and the display driver 320 may be disposed on the second surface 310_2S. The pressure sensor 500 may be integrated with the display circuit board 310. That is, the lower surface 500_2S of the pressure sensor 500 may be the same layer as the first surface 310_1S, which is the upper surface of the display circuit board 310. The upper surface 500_1S of the pressure sensor 500 may be provided with an adhesive layer PSA to be coupled with the panel lower member 400. Thus, the display circuit board 310 may be fixed to the panel lower member 400.

The display circuit board 310 may include a touch connector on the second surface 310_2S. The touch circuit board 210 may be bent together with the display circuit board 310, and the touch connection portion provided at one end of the bent touch circuit board 210 may be connected to the touch connector. Thus, the touch driver 220 may be electrically connected to the display circuit board 310.

Figure 7:
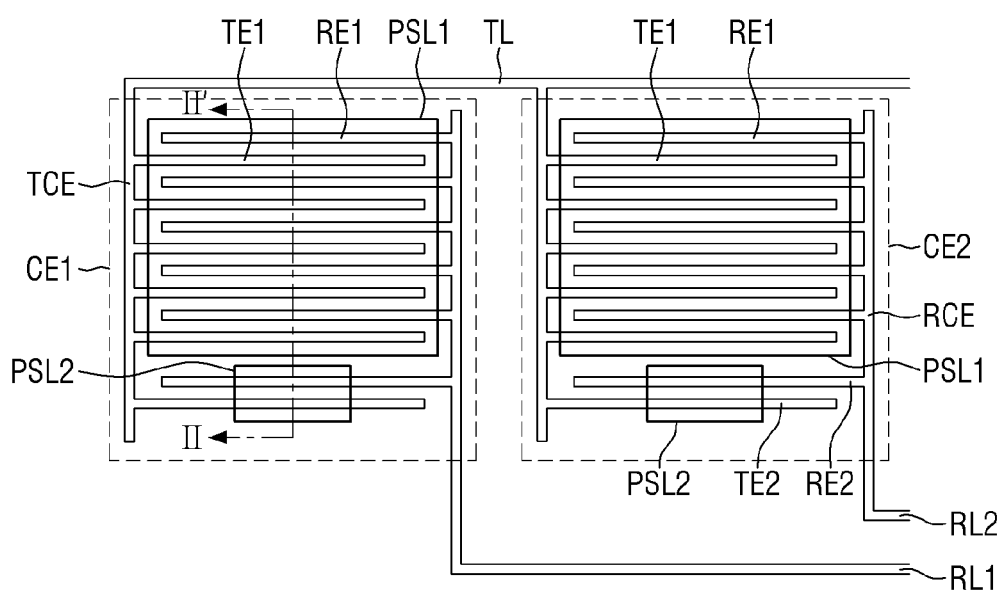
FIG. 7 is a bottom, plan view showing the area "A" of FIG. 6.
Figure 9:
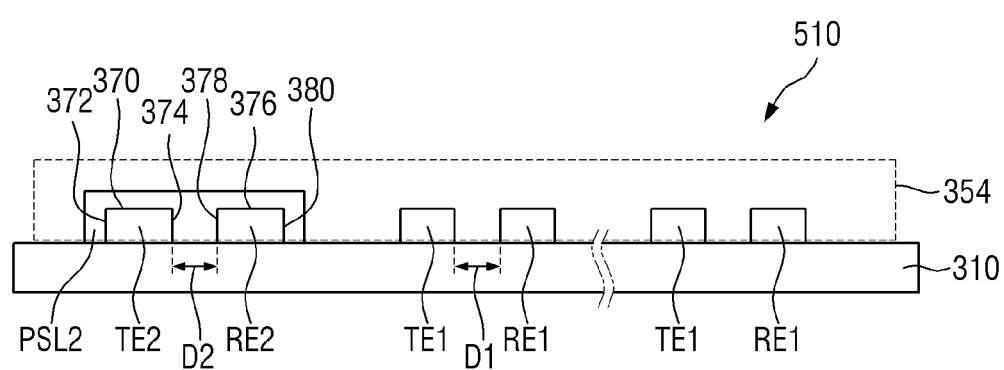
FIG. 9 is a cross-sectional view of the pattern portion of FIG. 8.
Figure 10:
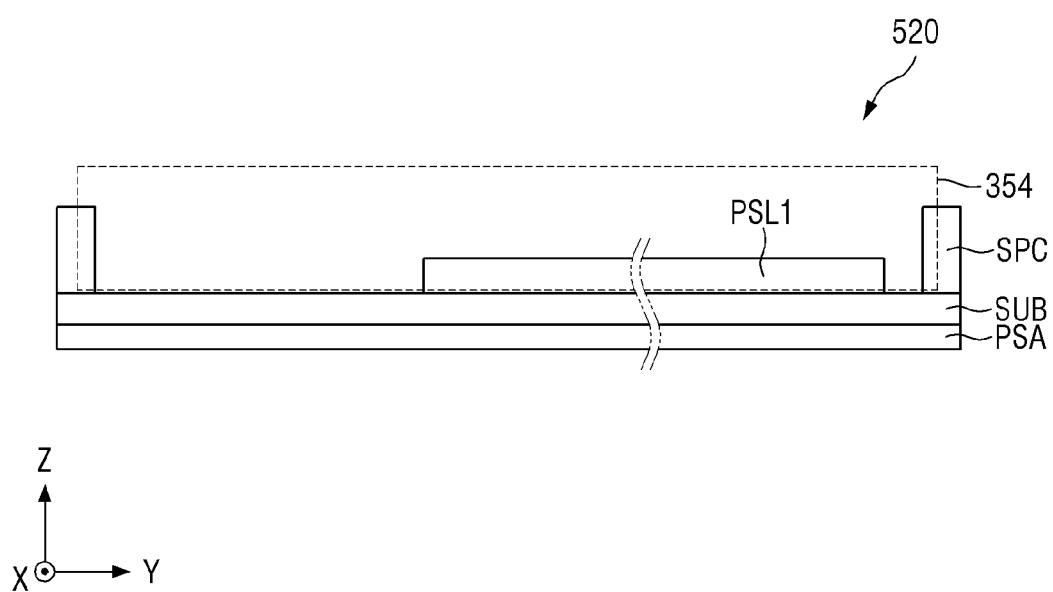
FIG. 10 is a cross-sectional view of the cover portion of FIG. 8, which has been inverted 180 degrees from the position shown in FIG. 8.
Figure 11:
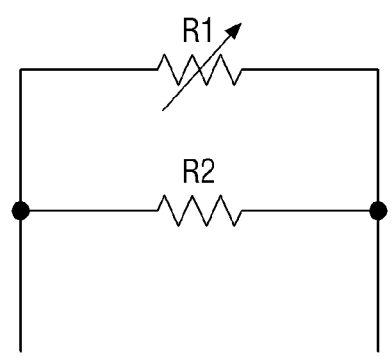
FIG. 11 is an equivalent circuit diagram of the pressure sensor of FIG. 7.

FIG. 6 is a bottom, plan view of an exemplary embodiment of a pressure sensor integrated with the display circuit board of FIG. 2, FIG. 7 is a bottom, plan view showing the area "A" of FIG. 6, FIG. 8 is a cross-sectional view taken along the line II-II' of FIG. 7, FIG. 9 is a cross-sectional view of the pattern portion of FIG. 8, FIG. 10 is a cross-sectional view of the cover portion of FIG. 8, which has been inverted 180 degrees from the position shown in FIG. 8, and FIG. 11 is an equivalent circuit diagram of the pressure sensor of FIG. 7.

Referring to FIGS. 6 to 11, the pressure sensor 500 may include a pattern or pattern portion 510 disposed directly on the display circuit board 310, and a cover or cover portion 520 disposed to overlap the pattern portion 510.

According to an embodiment, the pattern portion 510 may include a first driving electrode TE1, a first sensing electrode RE1, a second driving electrode TE2, a second sensing electrode RE2, a driving line TL, first to p-th lines RL1 to RLp (p is an integer of 2 or more), and a second pressure sensing layer PSL2. The cover portion 520 may include a substrate SUB as a base layer. One surface of the substrate SUB may be provided with a first pressure sensing layer PSL1 and a spacer SPC, and the other surface of the substrate SUB may be provided with an adhesive layer PSA. Pressure sensing cells CE1 to CEp may be provided between the pattern portion 510 and the cover portion 520.

The pressure sensor 500 may have a shape extending in one direction, for example, X-axis direction, in a plan view. In this case, the length of the pressure sensor 500 in the extending direction may be larger than the width thereof. However, the shape of the pressure sensor 500 is not limited thereto, and the shape of the pressure sensor 500 may vary depending on the applied position.

The pressure sensing cells CE1 to CEp are arranged between the pattern portion 510 and the cover portion 520. The driving line TL and the first to p-th sensing lines RL1 to RLp are arranged on one surface of the pattern portion 510 facing the cover portion 520.

Each of the pressure sensing cells CE1 to CEp may independently detect the pressure at the corresponding position. Although FIG. 6 shows that the pressure sensing cells CE1 to CEp are arranged in one row, the exemplary embodiments are not limited thereto. If necessary, the pressure sensing cells CE1 to CEp may be arranged in a plurality of rows. Further, the pressure sensing cells CE1 to CEp may be arranged to be spaced apart from each other at predetermined intervals as shown in FIG. 6, or may be arranged continuously.

The pressure sensing cells CE1 to CEp may have different areas depending on the use. For example, when the pressure sensing cells CE1 to CEp are used to detect the pressure applied to the front surface of the display device 1 as shown in FIG. 6, the pressure sensing cells CE1 to CEp may be formed to have a size corresponding to the pressure sensing area.

Each of the pressure sensing cells CE1 to CEp may be connected to at least one driving line and at least one sensing line. For example, the pressure sensing cells CE1 to CEp may be connected commonly to one driving line TL as shown in FIG. 6, whereas each of the pressure sensing cells CE1 to CEp may be connected individually to the sensing lines RL1 to RLp. The first pressure sensing cell CE1 may be connected to the driving line TL and the first sensing line RL1, and the second pressure sensing cell CE2 may be connected to the driving line TL and the second sensing line RL2. Further, the third pressure sensing cell CE3 may be connected to the driving line TL and the third sensing line RL3, and the p-th pressure sensing cell CEp may connected to the driving line TL and the p-th sensing line RLp.

The driving line TL and the first to p-th sensing lines RL1 to RLp may be connected to the display driver 320. That is, the display driver 320 may be integrated with a pressure sensor driver. The display driver 320 may apply a driving voltage to the driving line TL, and the display driver 320 may detect current values or voltage values from the sensing lines RL1 to RLp, thereby detecting the pressure applied to the pressure sensing cells CE1 to CEp. Meanwhile, the driving line TL and the first to p-th sensing lines RL1 to RLp may be connected to a pressure sensor driver separately provided from the display driver 320.

The spacer SPC of the cover portion 520 may be a coupling layer disposed between the display circuit board 310 and the substrate SUB and coupling the display circuit board 310 and the substrate SUB. The coupling layer may be a pressure sensitive adhesive layer or an adhesive layer. The coupling layer may be disposed along the periphery of the pattern portion 510 and the cover portion 520. In one embodiment, the coupling layer may completely surround the edges of the pattern portion 510 and the cover portion 520 to seal the inside of the pressure sensor 500. Moreover, the coupling layer may serve to maintain a substantially constant distance between the pattern portion 510 and the cover portion 520. The coupling layer may not overlap the driving line TL, the sensing lines RL1 to RLp, and the pressure sensing cells CE1 to CEp. The coupling layer may be first attached to one surface of the cover portion 520 and then attached to one surface of the pattern portion 510 during a bonding process. Each of the pressure sensing cells CE1 to CEp includes a driving connection electrode TCE, a sensing connection electrode RCE, a first driving electrode TE1, a first sensing electrode RE1, a second driving electrode TE2, a second sensing electrode RE2, a first pressure sensing layer PSL1, and a second pressure sensing layer PSL2.

The driving connection electrode TCE, the sensing connection electrode RCE, the first driving electrode TE1, the first sensing electrode RE1, the second driving electrode TE2, the second sensing electrode RE2, and the second pressure sensing layer PSL2 are arranged on the pattern portion 510 facing the cover portion 520.

The driving connection electrode TCE is connected to the driving line TL and the first driving electrode TE1. Specifically, the driving connection electrode TCE is connected to the driving line TL at both ends in the length direction (Y-axis direction). The first driving electrodes TE1 may be branched in the width direction (X-axis direction) of the driving connection electrode TCE.

The sensing connection electrode RCE is connected to any one of the sensing lines RL1 to RLp and the first sensing electrode RE1. Specifically, the sensing connection electrode TCE is connected to any one of the sensing lines RL1 to RLp at one end in the length direction (Y-axis direction). The first sensing electrodes RE1 may be branched in the width direction (X-axis direction) of the sensing connection electrode RCE.

The first driving electrode TE1 and the first sensing electrode RE1 may be disposed on the same layer. The first driving electrode TE1 and the first sensing electrode RE1 may be made of the same material. For example, the first driving electrode TE1 and the first sensing electrode RE1 may include a conductive material such as silver (Ag) or copper (Cu). The first driving electrode TE1 and the first sensing electrode RE1 may be formed on the pattern portion 510 by a screen printing method.

The first driving electrodes TE1 and the first sensing electrodes RE1 are arranged adjacent to each other, but are not connected to each other. The first driving electrodes TE1 and the first sensing electrodes RE1 may be arranged substantially parallel with each other and elongated (in X-axis direction). The first driving electrodes TE1 and the first sensing electrodes RE1 are alternately arranged in the length direction (Y-axis direction) of the driving connection electrode TCE and the sensing connection electrode RCE. That is, the first driving electrodes TE1 and the first sensing electrodes RE1 are repeatedly arranged in order of the first driving electrode TE1, the first sensing electrode RE1, the first driving electrode TE1, and the first sensing electrode RE1 in the length direction (Y-axis direction) of the driving connection electrode TCE and the sensing connection electrode RCE. As such, the first driving electrodes and the first sensing electrodes are alternately spaced apart in a second direction intersecting the first direction.

The pressure sensor 500 can include an activation region 354 to generate an electrical signal in response to an externally applied condition. The cover portion 520 may include all or part of the activation region 354. The activation region 354 can include all or part of the first activation member, the second activation member, the first and second sensing electrodes RE1 and RE2 and first and second driving electrodes TE1 and TE2. In the illustrated embodiment, the first activation member is the first pressure sensing layer PSL1 and the second activation member is the second pressure sensing layer PSL2, which may be part of the pattern portion 510. The first pressure sensing layer PSL1 is disposed on one surface of the cover portion 520 facing the pattern portion 510. The first pressure sensing layer PSL1 may overlap the first driving electrodes TE1 and the first sensing electrodes RE1.

The first pressure sensing layer PSL1 may include a pressure sensitive material and a polymer resin in which the pressure sensitive material is disposed. The pressure sensitive material may be metal microparticles (or metal nanoparticles) such as nickel, aluminum, titanium, tin, or copper. For example, the first pressure sensing layer PSL1 may be a quantum tunneling composite (QTC) layer.

When pressure is not applied to the cover portion 520 in the height direction (Z-axis direction) of the pressure sensor 500, as shown in FIG. 8, there is a gap 360 between the first pressure sensing layer PSL1 and the first driving electrodes TE1 and between the first pressure sensing layer PSL1 and the first sensing electrodes RE1. That is, when the pressure is not applied to the cover portion 520, the first pressure sensing layer PSL1 is spaced apart from the first driving electrodes TE1 and the first sensing electrodes RE1.

When pressure is applied to the cover portion 520 in the height direction (Z-axis direction) of the pressure sensor 500, the first pressure sensing layer PSL1 is brought into contact with the first driving electrodes TE1 and the first sensing electrodes RE1. Accordingly, the first driving electrode TE1 and the first sensing electrode RE1 may be physically connected to each other through the first pressure sensing layer PSL1, and the first pressure sensing layer PSL1 may act as electrical resistance.

The display driver 320 performing the function of the pressure sensor driver together may detect the current or voltage of the sensing line of the pressure sensor 500 after applying a driving voltage to the driving line TL of the pressure sensor 500, thereby calculating the resistance values of the pressure sensing cells connected to the sensing line.

As described above, in the pressure sensor 500, the contact area of the first pressure sensing layer PSL1 with the first driving electrode TE1 and the first sensing electrode RE1 is changed depending on the applied pressure, and thus the resistance value of the pressure sensing cell may be changed. Accordingly, the pressure sensor 500 may detect the pressure that a user applies by hand.

The second driving electrode TE2 may be branched in the width direction (X-axis direction) of the driving connection electrode TCE. The second driving electrode TE2 may be disposed substantially parallel with the first driving electrode TE1.

The second sensing electrode RE2 may be branched in the width direction (X-axis direction) of the sensing connection electrode RCE. The second sensing electrode RE2 may be disposed substantially parallel with the first sensing electrode RE1.

The second driving electrode TE2 and the second sensing electrode RE2 may be disposed on the same layer as the first driving electrode TE1 and the first sensing electrode RE1. The second driving electrode TE2 and the second sensing electrode RE2 may be made of the same material as the first driving electrode TE1 and the first sensing electrode RE1. For example, the second driving electrode TE2 and the second sensing electrode RE2 may include a conductive material such as silver (Ag) or copper (Cu). The second driving electrode TE2 and the second sensing electrode RE2 may be formed on the first substrate SUB1 by a screen printing method.

The second driving electrode TE2 and the second sensing electrode RE2 are disposed adjacent to each other, but are not connected to each other. The second driving electrode TE2 and the second sensing electrode RE2 may be arranged substantially parallel with each other.

The second driving electrode TE2 and the second sensing electrode RE2 may not overlap the first pressure sensing layer PSL1 of the cover portion 520. The second sensing electrode RE2 may be disposed between the second driving electrode TE2 and the first driving electrode TE1. In this case, the distance (D2) between the second driving electrode TE2 and the second sensing electrode RE2 may be shorter than the distance (D1) between the first driving electrode TE1 and the second sensing electrode RE2.

The second pressure sensing layer PSL2 may be brought into contact with the second driving electrode TE2 and the second sensing electrode RE2. That is, the second driving electrode TE2 and the second sensing electrode RE2 may be connected to each other through the second pressure sensing layer PSL2.

The second pressure sensing layer PSL2 may be disposed to cover the second driving electrode TE2 and the second sensing electrode RE2 as shown in FIG. 8. The second pressure sensing layer PSL2 may be disposed to cover the upper surface 370 and side surfaces 372 and 374 of the second driving electrode TE2 and the upper surface 376 and side surfaces 378 and 380 of the second sensing electrode RE2. The second pressure sensing layer PSL2 may not overlap the first pressure sensing layer PSL1.

The second pressure sensing layer PSL2 may be formed of the same material as the first pressure sensing layer PSL1. In this case, the second pressure sensing layer PSL2 may include a pressure sensitive material and a polymer resin in which the pressure sensitive material is disposed. The pressure sensitive material may be metal microparticles such as nickel, aluminum, titanium, tin, or copper. For example, the second pressure sensing layer PSL2 may be a quantum tunneling composite (QTC) layer.

The first pressure sensing cell CE1 includes a first resistance R1 and a second resistance R2 connected in parallel between the driving line TL and the first sensing line RL1 as shown in FIG. 7. The first resistance R1 indicates a resistance generated by the first pressure sensing layer PSL1 disposed between the first driving electrodes TE1 and the first sensing electrodes RE1, and the second resistance R2 indicates a resistance generated by the second pressure sensing layer PSL2 disposed between the second driving electrode TE2 and the second sensing electrode RE2. Since the contact area of the first pressure sensing layer PSL1 with the first driving electrodes TE1 and the first sensing electrodes RE1 is changed depending on the pressure, the first resistance R1 corresponds to a variable resistance.

That is, since each of the first to p-th pressure sensing cells CE1 to CEp includes the second resistance R2 regardless of the applied pressure, the resistance R of each of the first to p-th pressure sensing cells CE1 to CEp may be lowered.

Since the second driving electrode TE2 and the second sensing electrode RE2 are connected to the second pressure sensing layer PSL2 to form the second resistance R2, the number of the second driving electrodes TE2 and the number of the second sensing electrodes RE2 are not required to be large. In contrast, since the first driving electrode TE1 and the first sensing electrode RE1 detect the pressure according to the area contacting the first pressure sensing layer PSL1, the number of the first driving electrodes TE2 and the number of the second sensing electrodes RE2 are required to be large. The number of the second driving electrodes TE2 may be smaller than the number of the first driving electrodes TE1, and the number of the second sensing electrodes RE2 may be smaller than the number of the first sensing electrodes RE1.

As the thickness of the second driving electrode TE2 and the thickness of the second sensing electrode RE2 increase, the second resistance R2 may decrease. Further, as the width of the second driving electrode TE2 and the width of the second sensing electrode RE2 increase, the second resistance R2 may decrease. Further, as the number of the second driving electrodes TE2 contacting the second pressure sensing layer PSL2 and the number of the second sensing electrodes RE2 contacting the second pressure sensing layer PSL2 increase, the contact area between the second pressure sensing layer PSL2 and the second driving electrode TE2 and the contact area between the second pressure sensing layer PSL2 and the second sensing electrode RE2 increase, and thus the second resistance R2 may decrease. Further, as the area of the second pressure sensing layer PSL2 contacting the second driving electrode TE2 and the second sensing electrode RE2 increases, the second resistance R2 may decrease. Therefore, the size of the second resistance R2 may be designed in consideration of the thickness of the second driving electrode TE, the thickness of the second sensing electrode RE2, the width of the second driving electrode TE, the width of the second sensing electrode RE2, the number of the second driving electrodes TE2, the number of the second sensing electrodes RE2, and the area of the second pressure sensing layer PSL2 contacting the second driving electrode TE2 and the second sensing electrode RE2.

Figure 12:
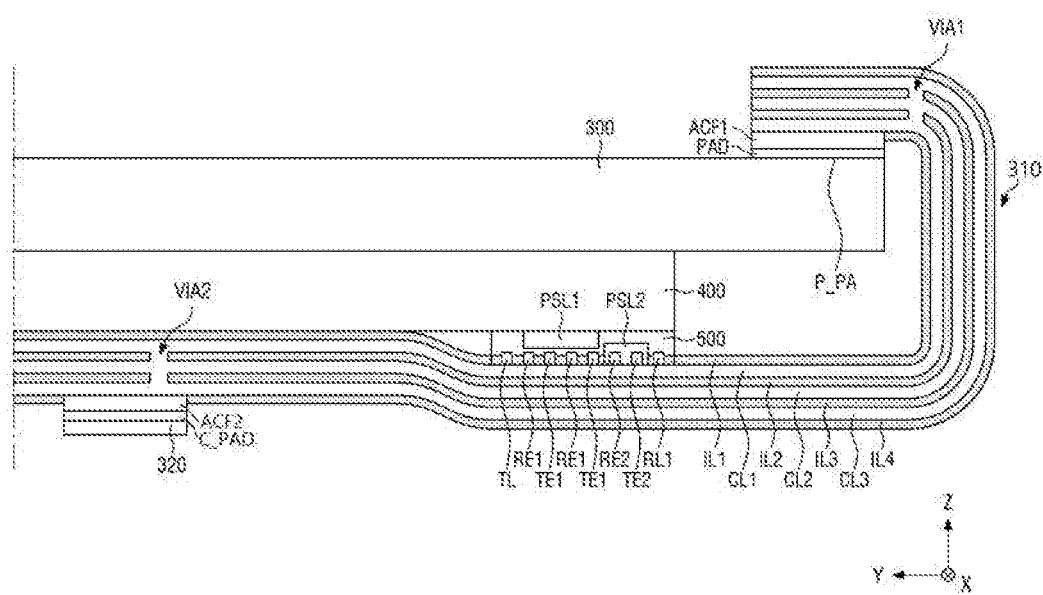
FIG. 12 is a schematic cross-sectional view of another exemplary embodiment of the display circuit board of FIG. 2.

FIG. 12 is a schematic cross-sectional view of another exemplary embodiment of the display circuit board of FIG. 2.

Referring to FIG. 12, the display circuit board 310 may have a multi-layer structure including a plurality of wiring layers. The display circuit board 310 may include a first insulating layer ILL a first wiring layer CL1 disposed on the first insulating layer ILL a second insulating layer IL2 disposed on the first wiring layer CL1, a second wiring layer CL2 disposed on the second insulating layer IL2, a third insulating layer IL3 disposed on the second wiring layer CL2, a third wiring layer CL3 disposed on the third insulating layer IL3, and a fourth insulating layer IL4 disposed on the third wiring layer CL3.

Although FIG. 12 shows the cross-sections of the first wiring layer CL1, the second wiring layer CL2, and the third wiring layer CL3, the exemplary embodiments are not limited thereto, and each of the first wiring layer CL1, the second wiring layer CL2, and the third wiring layer CL3 may have a specific wiring pattern. That is, it should be noted that electrical signals are conducted along the wiring pattern, and that the first wiring layer CL1, the second wiring layer CL2, and the third wiring layer CL3 are not conducted as a whole layer.

The first insulating layer IL1 is provided thereunder with the first wiring layer CL1 to cover the first wiring layer CL1 to protect the first wiring layer CL1. The first insulating layer IL1 may include an organic insulating material. Examples of the organic insulating material may include polyacrylate resins, epoxy resins, phenolic resins, polyamide resins, polyimide resins, unsaturated polyester resins, polyphenylene ether resins, polyphenylene sulfide resins, and benzocyclobutene (BCB).

The first insulating layer IL1 may expose the first wiring layer CL1 in the panel pad area P_PA and the area where the pressure sensor 500 is disposed. A signal wiring PAD may be disposed on the panel pad area P_PA. The signal wiring may include at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The signal wiring PAD may be a single layer including the above-exemplified material. Alternatively, the signal wiring PAD may be a laminated layer.

The first wiring layer CL1 exposed by the first insulating layer IL1 may be coupled to the signal wiring PAD disposed on the panel pad are P_PA. A first conductive coupling member ACF1 may be disposed between the first wiring layer CL1 and the signal wiring PAD. That is, the first wiring layer CL1 may be electrically connected to the signal wiring PAD through the first conductive coupling member ACF1. In some exemplary embodiments, the first wiring layer CL1 may be directly connected to the signal wiring PAD without the first conductive coupling member ACF1. That is, the first wiring layer CL1 may be directly connected to the upper surface of the exposed signal wiring PAD. For example, the first wiring layer CL1 may be ultrasonically bonded to the signal wiring PAD. The first wiring layer CL1 may include a metal material. The first wiring layer CL1 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The first driving electrode TE1, first sensing electrode RE1, second driving electrode TE2, second sensing electrode RE2, driving line TL, and first to p-th sensing lines RL1 to RLp of the pattern portion 510 may be formed on the first wiring layer CL1 by a screen printing method. The area of the pattern portion 510, excluding the first driving electrode TE1, the first sensing electrode RE1, the second driving electrode TE2, the second sensing electrode RE2, the driving line TL, and the first to p-th sensing lines RL1 to RLp, may be covered by the first insulating layer IL1. That is, the first driving electrode TE1, the first sensing electrode RE1, the second driving electrode TE2, the second sensing electrode RE2, the driving line TL, and the first to p-th sensing lines RL1 to RLp may be exposed without being covered by the first insulating layer IL1. Thus, when pressure is applied, the first driving electrode TE1, the first sensing electrode RE1, the second driving electrode TE2, the second sensing electrode RE2, the driving line TL, and the first to p-th sensing lines RL1 to RLp may be brought into contact with the first pressure sensing layer PSL1 of the cover portion 520.

The fourth insulating layer IL4 may expose the third wiring layer CL3 in an area where the display driver 320 is disposed. The third wiring layer CL3 exposed by the fourth insulating layer IL4 may be coupled to a circuit signal wiring C_PAD disposed on a circuit pad. A second conductive coupling member ACF2 may be disposed between the third wiring layer CL3 and the circuit signal wiring C_PAD. That is, the third wiring layer CL3 may be electrically connected to the circuit signal wiring C_PAD through the second conductive coupling member ACF2. The fourth insulating layer IL4 may include the same organic insulating material as the first insulating layer IL1. The third wiring layer CL3 may include the same metal material as the first wiring layer CL1.

In some exemplary embodiments, the third wiring layer CL3 may be directly connected to the circuit signal wiring C_PAD without the second conductive coupling member ACF2. That is, the third wiring layer CL3 may be directly connected to the upper surface of the exposed circuit signal wiring C_PAD. For example, the third wiring layer CL3 may be ultrasonically bonded to the circuit signal wiring C_PAD.

The second wiring layer CL2 may be electrically connected to the first wiring layer CL1 or the third wiring layer CL3 through via holes VIA1 and VIA2 formed in the second insulating layer IL2 and the third insulating layer IL3. The second insulating layer IL2 may be disposed between the first wiring layer CL1 and the second wiring layer CL2, and the third insulating layer IL3 may be disposed between the second wiring layer CL2 and the third wiring layer CL3, thereby functioning to physically separate the first wiring layer CL1 to third wiring layer CL3 from each other in the area other than the via holes VIA.

The first via hole VIA1 may be disposed near the panel pad area P_PA. Thus, each of the first wiring layer CL1 to the third wiring layer CL3 may be electrically connected to the signal wiring PAD. Although one first via hole VIA1 is shown for convenience of explanation, a via hole connecting the first wiring layer CL1 and the signal wiring PAD, a via hole connecting the second wiring layer CL2 and the signal wiring PAD, a via hole connecting the third wiring layer CL3 and the signal wiring PAD may be formed in different places in a plan view.

The second via hole VIA2 may overlap the display driver 320. Thus, the first driving electrode TE1, the first sensing electrode RE1, the second driving electrode TE2, the second sensing electrode RE2, the driving line TL, and the first to p-th sensing lines RL1 to RLp, which are formed on the first wiring layer CL1, may be electrically connected to the circuit signal wiring C_PAD where circuit pads are arranged.

According to an embodiment, the driving line TL and the first to p-th sensing lines RL1 to RLp may extend to an area overlapping the circuit signal wiring C_PAD along the wiring formed on the first wiring layer CL1. In this case, when the wiring disposed on the second wiring layer CL2 and/or the third wiring layer CL3 does not overlap the driving line TL and first to p-th sensing lines RL1 to RLp extending to the area overlapping the circuit signal wiring C_PAD along the first wiring layer CL1, the second via hole VIA2 may be formed linearly in the thickness direction (Z-axis direction). Although one second via hole VIA2 is shown for convenience of explanation, a via hole connecting the driving line TL and the circuit signal wiring C_PAD and a plurality of via holes connecting the first to p-th sensing lines RL1 to RLp and circuit signal wiring C_PAD may be formed in different places in a plan view.

The second insulating layer IL2 and the third insulating layer IL3 may include at least one of a silicon compound and a metal oxide. For example, the second insulating layer IL2 and the third insulating layer IL3 may include at least one of silicon oxide, silicon nitride, silicon oxynitride, aluminum oxide, tantalum oxide, hafnium oxide, zirconium oxide, and titanium oxide. These compounds may be used alone or in combination with each other.

Hereinafter, display devices according to other exemplary embodiments will be described. In the following exemplary implementations, the same components as those in the aforementioned exemplary embodiments will be referred to with the same reference numerals, and descriptions thereof will be omitted or simplified to avoid redundancy.

Figure 13:
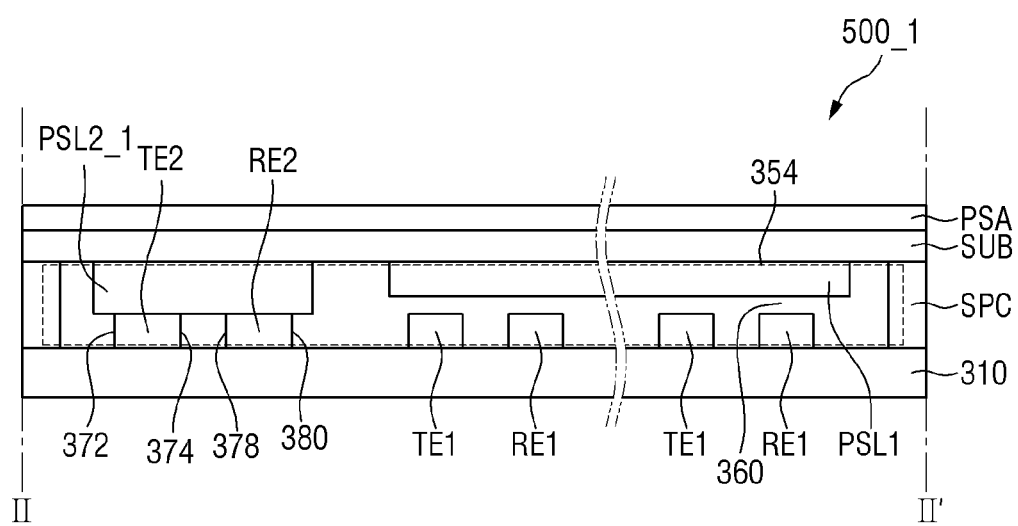
FIG. 13 is a cross-sectional view of still another exemplary embodiment of a pressure sensor including the display circuit board taken along the line II-II' of FIG. 7.
Figure 13:
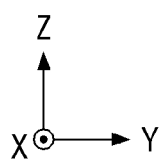
Figure 14:
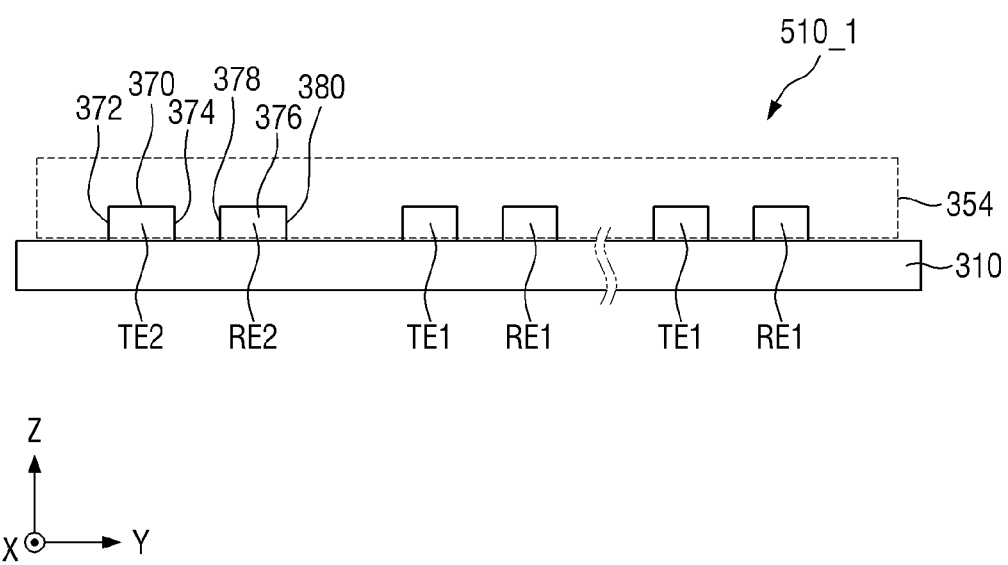
FIG. 14 is a cross-sectional view of the pattern portion of FIG. 13.
Figure 15:
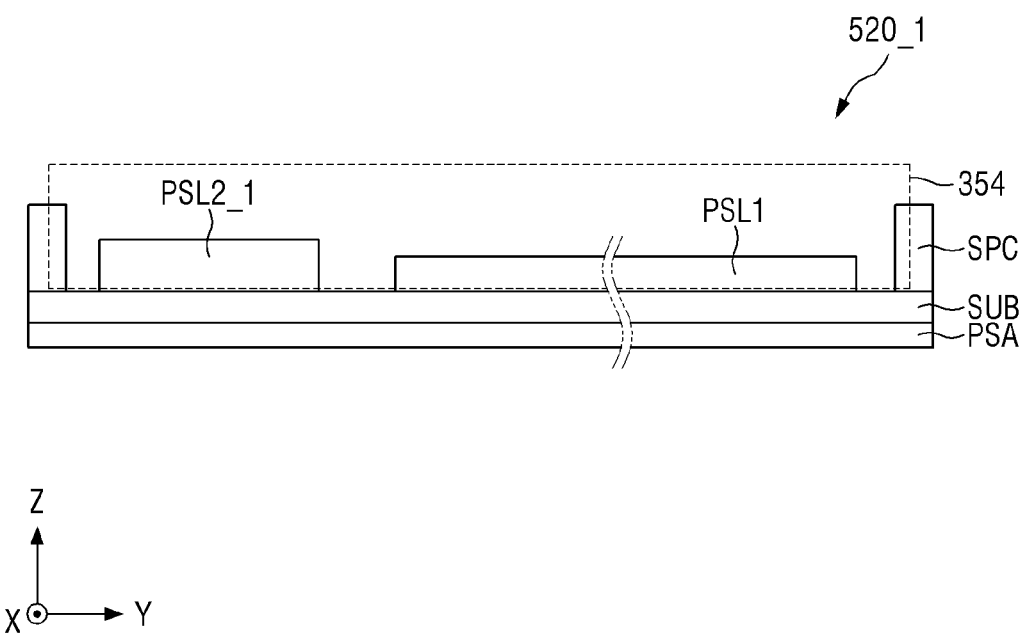
FIG. 15 is a cross-sectional view of the cover portion of FIG. 13, which has been inverted 180 degrees from the position shown in FIG. 13.
Figure 16:
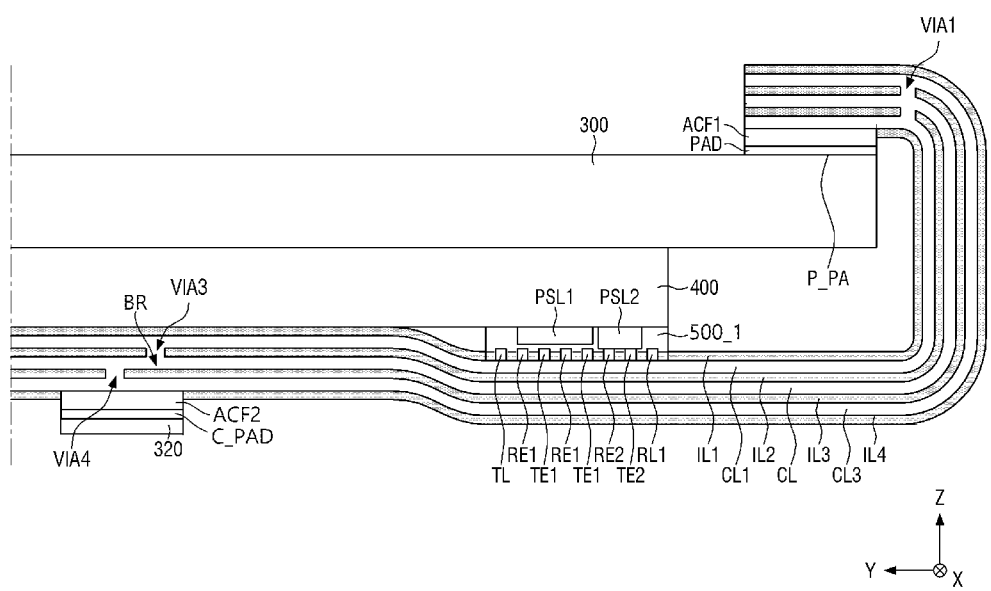
FIG. 16 is a schematic cross-sectional view of the still another exemplary embodiment of the display circuit board of FIG. 2.

FIG. 13 is a cross-sectional view of still another exemplary embodiment of a pressure sensor including the display circuit board taken along the line II-II' of FIG. 7, FIG. 14 is a cross-sectional view of the pattern portion of FIG. 13, FIG. 15 is a cross-sectional view of the cover portion of FIG. 13, which has been inverted 180 degrees from the position shown in FIG. 13, and FIG. 16 is a schematic cross-sectional view of the still another exemplary embodiment of the display circuit board of FIG. 2.

The embodiment of FIGS. 13 to 16 is different from the aforementioned embodiment of FIGS. 8 to 10 in that a second pressure sensing layer PSL2_1 is disposed on a cover portion 520_1, not on a pattern portion 510_1. The second activation member may include the second pressure sensing layer PSL2_1 and in this illustrated embodiment is the second pressure sensing layer PSL2_1, and part of the cover portion 520.

More specifically, a pressure sensor 500_1 may include a pattern portion 510_1 formed on the display circuit board 310 and a cover portion 520_1 disposed to overlap the pattern portion 510_1. According to an embodiment, the pattern portion 510_1 may include a first driving electrode TE1, a first sensing electrode RE1, a second driving electrode TE2, a second sensing electrode RE2, a driving line TL, and first to p-th sensing lines RL1 to RLp (p is an integer of 2 or more). The cover portion 520_1 may include a substrate SUB as a base layer. One surface of the substrate SUB may be provided with a first pressure sensing layer PSL1, a second pressure sensing layer PSL2_1, and a spacer SPC, and the other surface of the substrate SUB may be provided with an adhesive layer PSA.

When the pattern portion 510_1 and the cover portion 520_1 are coupled to each other, the second pressure sensing layer PSL2_1 may be brought into contact with the second driving electrode TE2 and the second sensing electrode RE2. As shown in FIG. 13, one surface of the second pressure sensing layer PSL2_1 may be brought into contact with the upper surfaces of the second driving electrode TE2 and the second sensing electrode RE2, but may not be brought into contact with the side surfaces of the second driving electrode TE2 and the second sensing electrode RE2. In the embodiment shown in FIGS. 8 to 10, since the second pressure sensing layer PSL2_1 is formed directly on the second driving electrode TE2 and the second sensing electrode RE2, the second pressure sensing layer PSL2_1 may be brought into contact with the upper surface 370 and side surfaces 372 and 374 of the second driving electrode TE2 and the upper surface 376 and side surfaces 378 and 380 of the second sensing electrode RE2.

As shown in FIG. 13, the second pressure sensing layer PSL2_1 may be higher in height than the first pressure sensing layer PSL1. The reason for this is due to the fact that, when the pattern portion 510_1 and the cover portion 520_1 are coupled to each other, the second pressure sensing layer PSL2_1 is required to be brought into contact with the second driving electrode TE2 and the second sensing electrode RE2, whereas the first pressure sensing layer PSL1 is required to be spaced apart from the first driving electrode TE1 and the first sensing electrode RE1.

The embodiment of FIG. 16 is different from the aforementioned embodiment of FIG. 12 in that the driving line TL and first to p-th sensing lines RL1 to RLp of the pressure sensor 500_1 and the circuit signal wiring C_PAD are connected to each other in the thickness direction through via holes VIA3 and VIA4, which are not formed linearly, as compared with the embodiment of FIG. 12 in which they are connected to each other through the linearly formed via hole VIA2.

More specifically, the third via hole VIA3 and the fourth via hole VIA4 may be arranged to overlap the display driver 320. Thus, the first driving electrode TE1, the first sensing electrode RE1, the second driving electrode TE2, the second sensing electrode RE2, the driving line TL, and the first to p-th sensing lines RL1 to RLp, which are formed on the first wiring layer CL1, may be electrically connected to the circuit signal wiring C_PAD where circuit pads are arranged.

According to an embodiment, the driving line TL and the first to p-th sensing lines RL1 to RLp may extend to an area overlapping the circuit signal wiring C_PAD along the wiring formed on the first wiring layer CL1. In this case, when the wiring disposed on the second wiring layer CL2 and/or the third wiring layer CL3 overlaps the driving line TL and first to p-th sensing lines RL1 to RLp extending to the area overlapping the circuit signal wiring C_PAD along the first wiring layer CL1, the wiring disposed on the second wiring layer CL2 and the third wiring layer CL3 may be bypassed by a bridge wiring BR connecting the third via hole VIA3 and the fourth via hole VIA4. The bridge wiring BR may be disposed on the second wiring layer CL2. Although one third via hole VIA3 and one fourth via hole VIA4 is respectively shown for convenience of explanation, via holes connected through the bridge wiring BR to connect the driving line TL and the circuit signal wiring C_PAD and a plurality of via holes connected to through the bridge wiring BR to connect the first to p-th sensing lines RL1 to RLp and circuit signal wiring C_PAD may be formed in different places in a plan view.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
a display panel;
a printed circuit board below the display panel;
a panel lower member between the display panel and the printed circuit board; and
an adhesive member between the panel lower member and the printed circuit board, wherein the printed circuit board comprises:
a pattern portion including a surface, a first driving electrode and a first sensing electrode disposed on the surface; and
a cover portion facing the surface of the pattern portion;
wherein the cover portion comprises:
a substrate; and
a first pressure sensing layer disposed on a first surface of the substrate that faces the first driving electrode and the first sensing electrode, the first pressure sensing layer overlapping the first driving electrode and the first sensing electrode,
wherein the adhesive member is adhered to a second surface of the substrate opposite to the first surface and the panel lower member.

2. The display device of claim 1, further comprising an insulating layer disposed on the surface of the pattern portion, the insulating layer exposing the first driving electrode and the first sensing electrode.

3. The display device of claim 1, wherein the pattern portion further includes a second driving electrode and a second sensing electrode disposed on the surface of the pattern portion.

4. The display device of claim 3, wherein the pattern portion further includes a second pressure sensing layer contacting the second driving electrode and the second sensing electrode.

5. The display device of claim 4, wherein the second pressure sensing layer is disposed on at least one side surface of the second driving electrode and at least one side surface of the second sensing electrode.

6. The display device of claim 1, wherein a gap is provided between the first pressure sensing layer and the first driving electrode and between the first pressure sensing layer and the first sensing electrode.

7. The display device of claim 6, wherein the cover portion further includes a spacer to maintain the gap.

8. The display device of claim 1, wherein the printed circuit board is bent and electrically connected to the display panel.

9. The display device of claim 1, wherein
the first driving electrode comprises a plurality of first driving electrodes and the first sensing electrode comprises a plurality of first sensing electrodes spaced apart from each other,
the first driving electrodes and the first sensing electrodes are elongated in a first direction, and
the first driving electrodes and the first sensing electrodes are alternately spaced apart in a second direction intersecting the first direction.

10. The display device of claim 9, further comprising:
a driving connection electrode coupled to the first driving electrodes and second driving electrodes; and
a sensing connection electrode coupled to the first sensing electrodes and second sensing electrodes.

11. The display device of claim 10, further comprising:
a driving line coupled to the driving connection electrode to apply a driving voltage; and
a sensing line coupled to the sensing connection electrode.

12. The display device of claim 11, wherein the printed circuit board includes a pressure sensing driver on a second surface opposite to the surface of the printed circuit board, and
the pressure sensing driver is electrically coupled to the driving line and the sensing line through a contact hole.

13. A display device, comprising:
a display panel;
a printed circuit board below the display panel;
a panel lower member between the display panel and the printed circuit board; and
an adhesive member between the panel lower member and the printed circuit board, wherein the printed circuit board comprises:
a pattern portion including a surface, a first driving electrode, a first sensing electrode, a second driving electrode, and a second sensing electrode, which are disposed on the surface; and
a cover portion facing the surface of the pattern portion;
wherein the cover portion comprises:
a substrate;
a first pressure sensing layer disposed on a first surface of the substrate that faces the first driving electrode and the first sensing electrode, the first pressure sensing layer overlapping the first driving electrode and the first sensing electrode; and
a second pressure sensing layer disposed on the first surface of the substrate, the second pressure sensing layer overlapping the second driving electrode and the second sensing electrode,
wherein the adhesive member is adhered to a second surface of the substrate opposite to the first surface and the panel lower member.

14. The display device of claim 13, further comprising an insulating layer disposed on the surface of the pattern portion, the insulating layer exposing the first driving electrode, the first sensing electrode, the second driving electrode, and the second sensing electrode.

15. The display device of claim 13, wherein a gap is provided between the first pressure sensing layer and the first driving electrode and between the first pressure sensing layer and the first sensing electrode.

16. The display device of claim 15, wherein the cover portion further includes a spacer to maintain the gap.

17. The display device of claim 15, wherein the second pressure sensing layer contacts the second driving electrode and the second sensing electrode.

* * * * *